US009476928B2

(12) United States Patent
Froman

(10) Patent No.: US 9,476,928 B2
(45) Date of Patent: Oct. 25, 2016

(54) SYSTEM AND METHOD FOR DETECTING SENSOR LEAKAGE

(71) Applicant: BELL HELICOPTER TEXTRON INC., Fort Worth, TX (US)

(72) Inventor: Gary Froman, Fort Worth, TX (US)

(73) Assignee: Textron Innovations Inc., Providence, RI (US)

(*) Notice: Subject to any disclaimer, the term of this patent is extended or adjusted under 35 U.S.C. 154(b) by 0 days.

(21) Appl. No.: 14/514,148

(22) Filed: Oct. 14, 2014

(65) Prior Publication Data

US 2015/0028883 A1     Jan. 29, 2015

Related U.S. Application Data

(63) Continuation-in-part of application No. 13/266,605, filed as application No. PCT/US2010/032657 on Apr. 28, 2010, now Pat. No. 8,860,429.

(60) Provisional application No. 61/173,474, filed on Apr. 28, 2009.

(51) Int. Cl.
| | | |
|---|---|---|
| *G01R 31/14* | (2006.01) | |
| *G01R 31/02* | (2006.01) | |
| *G01R 31/28* | (2006.01) | |
| *G01R 31/00* | (2006.01) | |

(52) U.S. Cl.
CPC ......... *G01R 31/025* (2013.01); *G01R 31/2829* (2013.01); *G01R 31/008* (2013.01)

(58) Field of Classification Search
CPC .................................................. G01R 27/025
USPC ....... 324/509, 522, 537, 601, 694, 698, 700, 324/763
See application file for complete search history.

(56) References Cited

U.S. PATENT DOCUMENTS

| | | | |
|---|---|---|---|
| 3,275,295 A | | 9/1966 | Caldwell |
| 3,619,723 A | * | 11/1971 | Walden .................... H02H 3/33 361/45 |
| 4,030,028 A | | 6/1977 | Allender |

(Continued)

FOREIGN PATENT DOCUMENTS

| | | |
|---|---|---|
| DE | 10044264 A1 | 10/2001 |
| EP | 0255143 A2 | 2/1988 |

(Continued)

OTHER PUBLICATIONS

Office Action dated May 20, 2014 from counterpart CA App. No. 2,759,235.

(Continued)

*Primary Examiner* — Huy Q Phan
*Assistant Examiner* — Giovanni Astacio-Oquendo
(74) *Attorney, Agent, or Firm* — James E. Walton

(57) ABSTRACT

A test system for testing a sensor system includes a high-impedance resistor for forming a voltage divider with any corrosion or foreign substance that might be present between a signal conductor and a ground conductor. While a voltage is applied across the voltage divider, the voltage can be measured across the high-impedance resistor for determining whether an undesirable amount of conductance exists between the signal wire and ground. The test system also includes switching means for switching between any number of signal wires of a system undergoing testing.

12 Claims, 8 Drawing Sheets

(56) References Cited

U.S. PATENT DOCUMENTS

| | | | |
|---|---|---|---|
| 4,099,861 A * | 7/1978 | Abel | A47L 9/2815 15/339 |
| 4,147,596 A * | 4/1979 | Baboian | G01N 17/02 123/41.15 |
| 4,267,505 A | 5/1981 | Biglin | |
| 4,413,221 A * | 11/1983 | Benjamin | G01R 31/3631 320/129 |
| 4,447,801 A * | 5/1984 | Masuda | G07C 5/0816 340/459 |
| 4,659,975 A | 4/1987 | Vincent | |
| 4,696,189 A * | 9/1987 | Hochreuther | G01D 11/24 324/149 |
| 4,845,435 A | 7/1989 | Bohan | |
| 5,139,627 A | 8/1992 | Eden | |
| 5,250,909 A | 10/1993 | Bitts | |
| 5,394,093 A | 2/1995 | Cervas | |
| 5,541,516 A | 7/1996 | Rider | |
| 5,635,841 A * | 6/1997 | Taylor | F02P 17/00 324/380 |
| 5,845,232 A | 12/1998 | Shively | |
| 5,875,413 A * | 2/1999 | Vinci | G01D 7/04 324/149 |
| 6,015,484 A | 1/2000 | Martinchek | |
| 6,114,856 A | 9/2000 | Bitts | |
| 6,132,857 A | 10/2000 | Champenois | |
| 6,225,809 B1 * | 5/2001 | Watano | G01N 27/60 324/464 |
| 6,776,889 B2 | 8/2004 | Atherton | |
| 6,987,396 B2 | 1/2006 | Yang | |
| 7,309,414 B2 | 12/2007 | Yang | |
| 7,498,823 B2 | 3/2009 | Cerutti | |
| 7,557,559 B1 * | 7/2009 | Olsson | G01V 3/081 324/156 |
| 8,015,864 B2 * | 9/2011 | Petrucelli | G01L 17/00 73/146.8 |
| 8,941,327 B2 * | 1/2015 | Ryu | H05B 33/0827 315/185 R |
| 2002/0097034 A1 | 7/2002 | Tanizawa | |
| 2003/0183268 A1 * | 10/2003 | Shanefield | H02N 11/002 136/205 |
| 2004/0096331 A1 | 5/2004 | Leach | |
| 2004/0211880 A1 * | 10/2004 | Erickson | G11B 7/126 250/205 |
| 2009/0109330 A1 * | 4/2009 | Nakano | G02B 7/08 348/374 |
| 2010/0036624 A1 * | 2/2010 | Martin | G01R 22/10 702/61 |
| 2010/0304107 A1 | 12/2010 | Nardi | |

FOREIGN PATENT DOCUMENTS

| | | |
|---|---|---|
| EP | 0822418 A2 | 2/1998 |
| JP | H0483182 A | 3/1992 |
| WO | 2004083877 A1 | 9/2004 |

OTHER PUBLICATIONS

Non-final Office Action dated Feb. 1, 2013 from U.S. Appl. No. 13/266,605.

Amendment dated May 1, 2013 from U.S. Appl. No. 13/266,605.

Amendment dated Jul. 22, 2013 from U.S. Appl. No. 13/266,605.

Final Office Action dated Aug. 1, 2013 from U.S. Appl. No. 13/266,605.

Amendment After Final dated Oct. 1, 2013 from U.S. Appl. No. 13/266,605.

Advisory Action dated Oct. 18, 2013 from U.S. Appl. No. 13/266,605.

Request for Continued Examination with Amendment dated Nov. 26, 2013 from U.S. Appl. No. 13/266,605.

Notice of Allowance dated Jun. 9, 2014 from U.S. Appl. No. 13/266,605.

Notice of Allowance dated Sep. 5, 2014 from U.S. Appl. No. 13/266,605.

Office Action dated Jun. 30, 2015 from counterpart CA App. No. 2,759,235.

Extended European Search Report dated Jan. 7, 2014 from counterpart EP App. No. 10770225.0.

International Search Report and Written Opinion dated Jul. 7, 2010 from counterpart PCT App. No. PCT/US2010/032657.

Article 34 Amendments dated Feb. 22, 2011 from counterpart PCT App. No. PCT/US2010/032657.

International Preliminary Report on Patentability dated Oct. 20, 2011 from counterpart PCT App. No. PCT/US2010/032657.

* cited by examiner

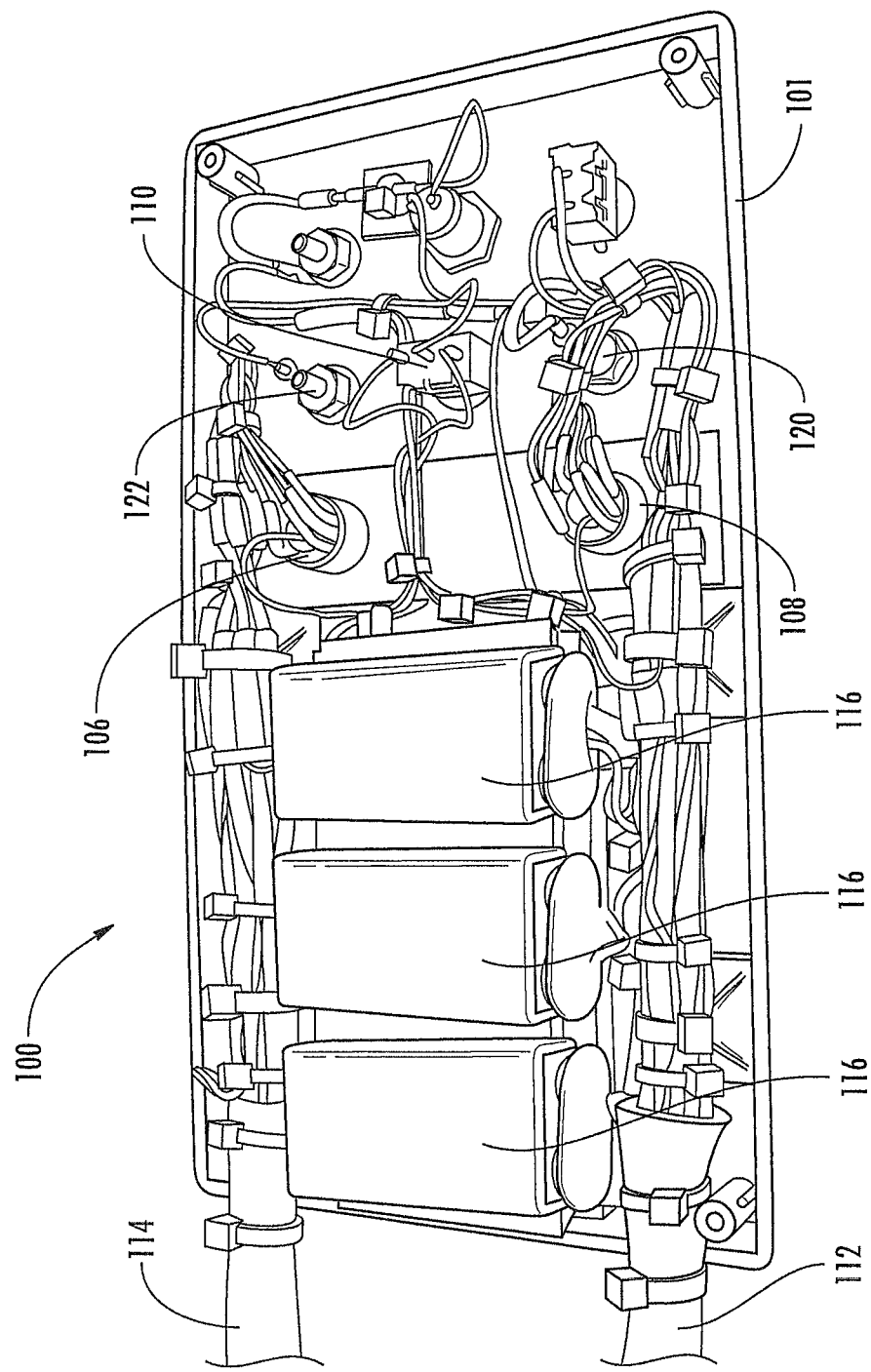

SYSTEM AND METHOD FOR DETECTING SENSOR LEAKAGE

CROSS REFERENCE TO RELATED APPLICATIONS

This application is a continuation in part of U.S. application Ser. No. 13/266,605, filed 27 Oct. 2011, titled "System and Method for Detecting Sensor Leakage," which is a 371 of international PCT application No. PCT/US10/32657, filed 28 Apr. 2010, titled "System and Method for Detecting Sensor Leakage," which claims the benefit of U.S. Provisional Application No. 61/173,474, filed 28 Apr. 2009, titled "System and Method for Detecting Sensor Leakage" all of which are hereby incorporated by reference for all purposes as if fully set forth herein.

BACKGROUND

1. Field of the Invention

The present application relates to systems and methods for testing sensors and systems including sensors. In particular, the present application relates to systems and methods for detecting the leakage of an electrical current in sensor systems.

2. Description of Related Art

Sensors such as those used on various types of vehicles are susceptible to contamination in their connectors that will degrade the sensor signal. This contamination might include such things as hydraulic fluid, gear oil, aluminum particles, and iron particles. This connector contamination is very difficult to detect and corrupts the data that is supplied by the individual vibration sensors to the monitoring computer. It has also been demonstrated that some defective sensors will couple some signal wires to the sensor case. The high impedance continuity between individual pins to connector shell can affect both amplitude and phase of the sensor signal.

Typically, connectors and wiring are tested with a common multimeter that measures continuity between individual sensor wires and the shell of the connector. This technique is not effective in measuring electrical continuity caused by contamination because the typical ohm meter operates at a low voltage of less than one volt. This low voltage is not sufficient to measure continuity through the contaminant. Also, checking individual wires one at a time is very time consuming, especially when there may be dozens of sensors installed for vibration monitoring and multiple wires associated with each sensor.

Other high voltage testers known as hi-pot testers are also available for testing wiring and connectors, but these testers are very expensive (tens of thousands of dollars), bulky, and usually damaging to the sensitive electronics inside the sensors.

Hence, there is a need for an improved system and method for detecting contamination and leakage of electrical current caused by the presence of contamination.

Although great strides have been made in the field of sensor leakage detectors, many shortcomings remain.

DESCRIPTION OF THE DRAWINGS

The novel features believed characteristic of the invention are set forth in the appended claims. However, the invention itself, as well as a preferred mode of use, and further objectives and advantages thereof, will best be understood by reference to the following detailed description when read in conjunction with the accompanying drawings, wherein:

FIG. 1B shows an internal view of the tester shown in FIG. 1A;

Figure 1A:
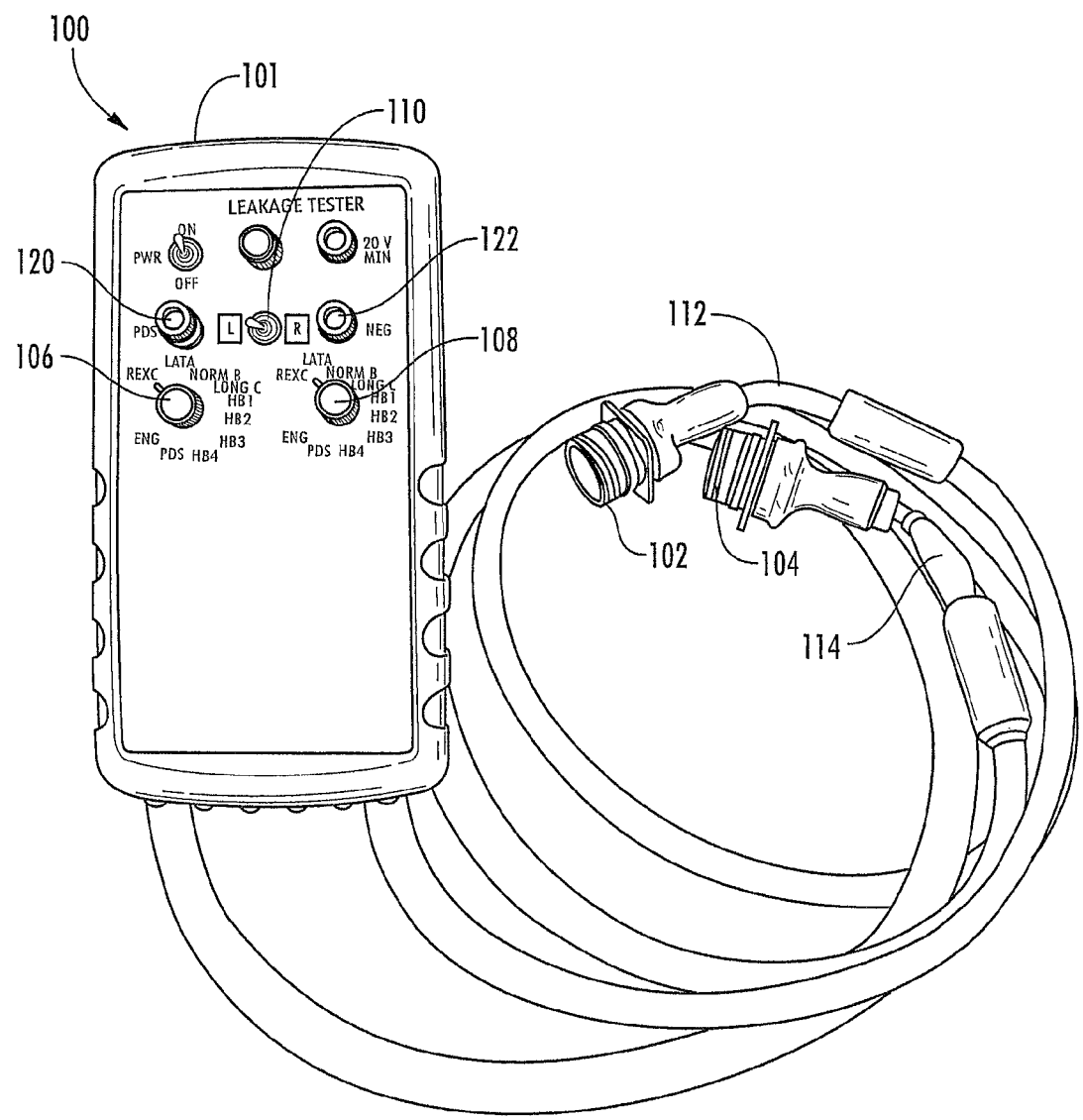
FIG. 1A shows a plan view of a tester according to the present application.

While the system and method of the present application is susceptible to various modifications and alternative forms, specific embodiments thereof have been shown by way of example in the drawings and are herein described in detail. It should be understood, however, that the description herein of specific embodiments is not intended to limit the invention to the particular embodiment disclosed, but on the contrary, the intention is to cover all modifications, equivalents, and alternatives falling within the spirit and scope of the process of the present application as defined by the appended claims.

DETAILED DESCRIPTION OF THE PREFERRED EMBODIMENT

Illustrative embodiments of the rotary system and method are provided below. It will of course be appreciated that in the development of any actual embodiment, numerous implementation-specific decisions will be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

In the specification, reference may be made to the spatial relationships between various components and to the spatial orientation of various aspects of components as the devices are depicted in the attached drawings. However, as will be recognized by those skilled in the art after a complete reading of the present application, the devices, members, apparatuses, etc. described herein may be positioned in any desired orientation. Thus, the use of terms such as "above," "below," "upper," "lower," or other like terms to describe a spatial relationship between various components or to describe the spatial orientation of aspects of such components should be understood to describe a relative relationship between the components or a spatial orientation of aspects of such components, respectively, as the device described herein may be oriented in any desired direction.

Referring first to FIGS. 1A and 1B, disclosed herein is a sensor leakage tester 100. Tester 100 includes connectors 102 and 104 that are configured to connect to the aircraft wiring at the vibration computer disconnect. Tester 100 is a hand-held tester that measures electrical leakage from sensor pins to the connector shell and cable shield. In the preferred embodiment, tester 100 does not require an external power source because it is internally battery powered, which adds to the portability of tester 100. Individual sensors are selected one at a time using the tester rotary switches 106 and 108 and left-right toggle switch 110, thereby enabling a plurality of sensors be tested within only a few minutes. Indications of electrical leakage for each sensor tell the maintainer that the specific sensor should be removed and cleaned, or replaced. A case 101 is configured to enclose the components of tester 100 while also providing a hand-held platform.

Figure 2:
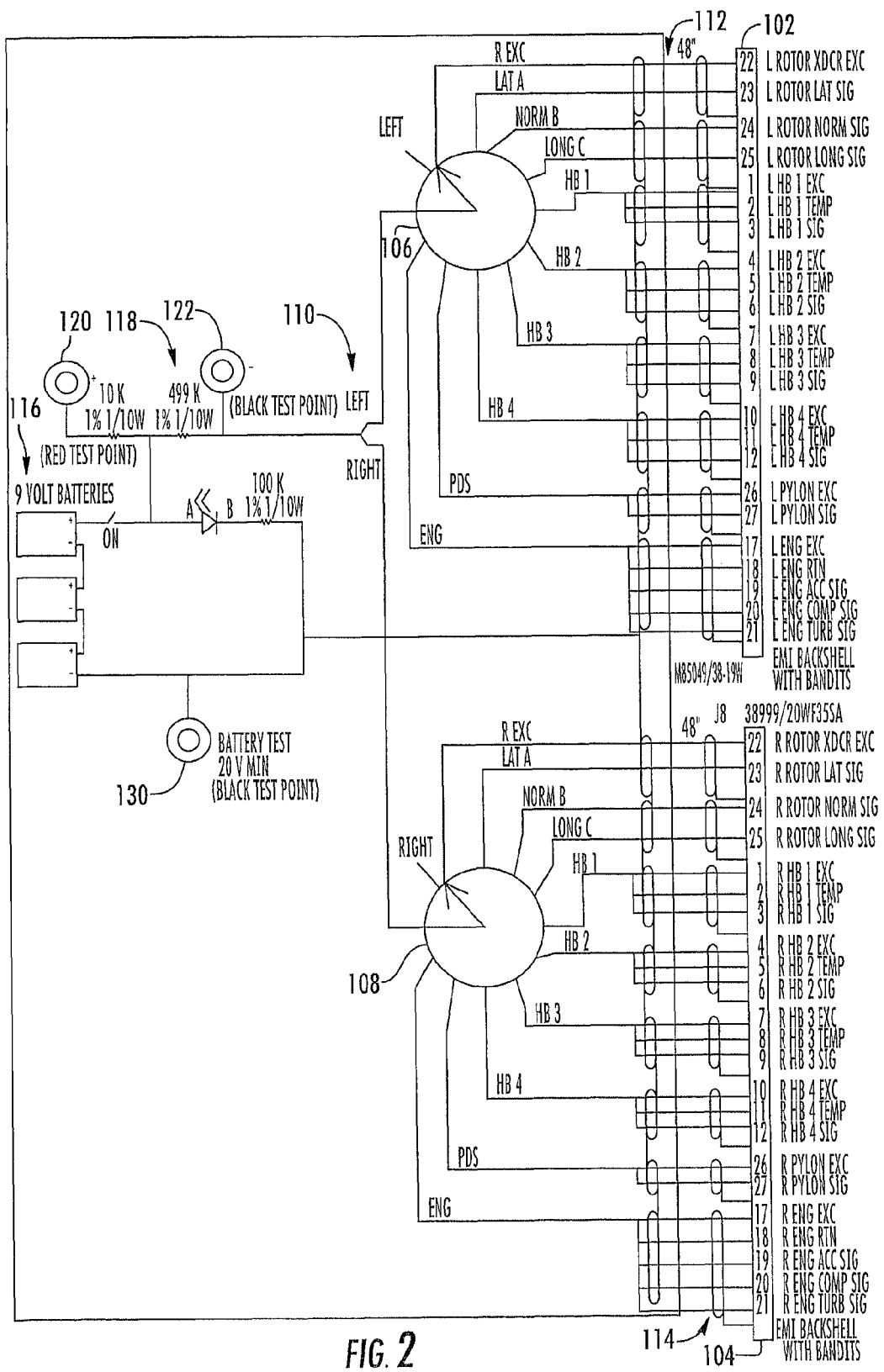
FIG. 2 shows a schematic view of the tester shown in FIG. 1A.

Referring also to FIG. 2, a schematic view is shown of tester 100. Tester 100 includes shielded cables 112 and 114 terminating at connectors 102 and 104, respectively, for connecting the tester 100 to aircraft wiring at the vibration computer disconnect. Through these two cables 112 and 114, all aircraft vibration sensor signals are accessible. It should be appreciated that a fewer or greater number of cables may be used, depending on the configuration of the vibration computer disconnect. Sensor power, signal ground, and signal wires for a given sensor are all tied together inside tester 100. By electrically connecting all of the sensor wires together for a given sensor, damage to the sensor electronics is not possible because all of the sensor wires are at the same electrical potential.

During operation, tester 100 applies a DC voltage (28 VDC in the illustrated embodiment, but other voltages can be used) from batteries 116 to these sensor signals through a high-impedance resistor 118, preferably in a range of 100 k Ohms to 1 M Ohm or more. The 28 VDC provides sufficient voltage at the contaminant to cause ionization of the contaminant, thus rendering the contaminant conductive. In the illustrated embodiment, the resistor 118 is a 499 k Ohm resistor. The battery power return is applied to the aircraft wiring shield (ground) through the mating connector shell. Test points 120 and 122 are provided across the resistor 118 for the operator to monitor with a voltmeter.

Figure 3:
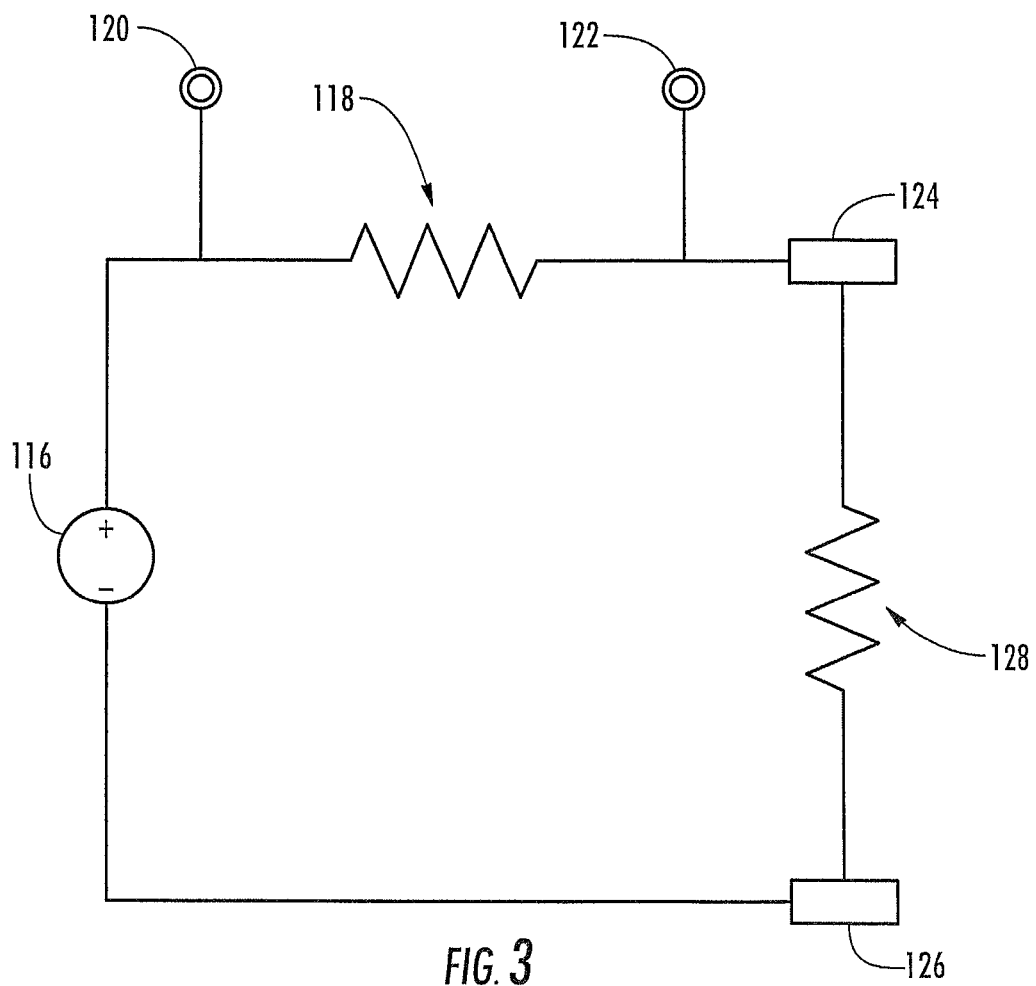
FIG. 3 shows a simplified schematic view of the tester shown in FIGS. 1A, 1B, and 2.

Referring now also to FIG. 3, which shows a simplified schematic view of the tester 100 wherein some elements of the tester 100 are not shown in order to more clearly illustrate the operation of the tester 100. The element 124 is representative of a signal line to a sensor undergoing testing, and the element 126 is representative of signal ground line—such as a shielding, connector housing, or sensor housing—associated with the sensor undergoing testing. The resistor 128 is representative of any defect or foreign substance such as corrosion or other unwanted material that might be allowing unwanted electrical conductance between the signal line 124 and ground 126. The tester 100 is configured to detect the presence and degree of conductance provided by this unwanted material.

The resistor 118 and the resistor 128 constitute a voltage divider. Thus, the voltage across the resistor 118 can be used to determine the amount of leakage from the sensor wires 124 to the sensor case 126. The voltage $V_{R1}$ across the resistor 118 follows the voltage divider equation as shown below in Equation (1):

$$V_{R1} = V_{DC} \frac{R_1}{R_1 + R_2} \quad (1)$$

where $V_{DC}$ is the input voltage from voltage source 116, $R_1$ is the resistance of resistor 118, and $R_2$ is the resistance of the leakage path resistor 128. The voltage $V_{R1}$ is measured across test points 120 and 122, and the input voltage is known or can be measured between test point 120 and battery test point 130 shown in FIG. 2. The resistance $R_1$ is also a known quantity. Thus, Equation (1) can be rearranged as shown below in Equation (2) and used to calculate the amount of leakage resistance $R_2$, which is the inverse of the amount of conductance that may be present due to unwanted foreign substances or defects.

$$R_2 = R_1 \left( \frac{V_{DC}}{V_{R1}} - 1 \right) \quad (2)$$

The Equations (1) and (2) can be used to create a look-up table such as Table 1 below, which an operator or computer can use to determine whether the sensor has passed or failed the test. It should be noted that the values shown in Table 1 are merely exemplary based on the exemplary values of the present embodiment for the voltage $V_{DC}$ and the resistor $R_1$. The values in Table 1 will vary depending on the actual voltages and resistor values used in actual implementations of the tester 100.

TABLE 1

| VOLTS DC | OHMS |
|---|---|
| 0.1 | 140M |
| 0.2 | 70M |
| 0.5 | 28M |
| 1.0 | 14M |
| 2.0 | 7M |
| 3.0 | 4M |
| 4.0 | 3M |
| 5.0 | 2.3M |
| 6.0 | 1.8M |
| 7.0 | 1.5M |
| 8.0 | 1.3M |

Figure 4:
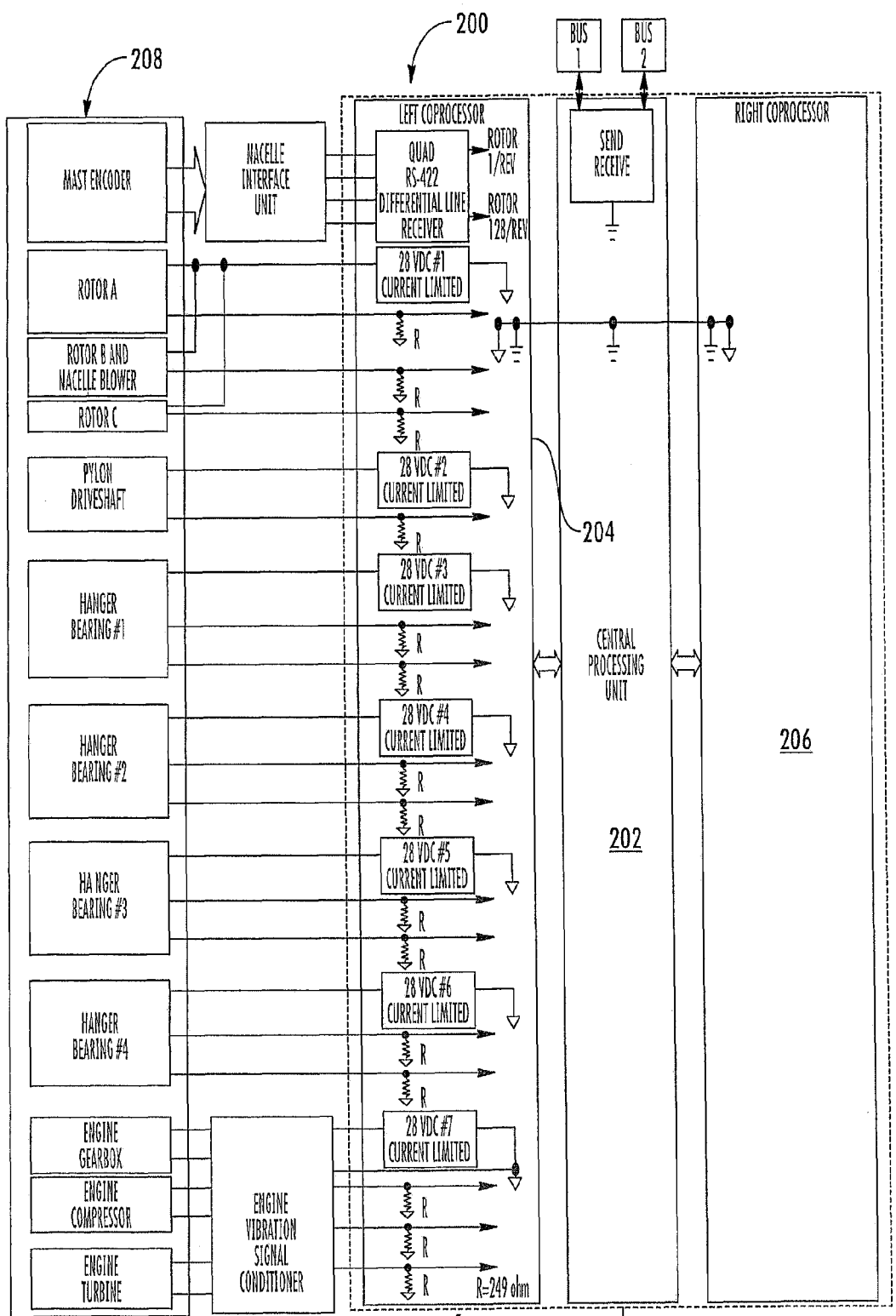
FIG. 4 shows a block diagram of a sensor system that can be tested using the tester shown in FIGS. 1A-3.

Referring now also to FIG. 4, which shows a block diagram of a Health and Usage Monitoring System (HUMS) 200 of an aircraft. The system 200 is shown merely in order to provide an example of a system having sensors that can be tested by tester 100. Other sensor systems can also be tested by various embodiments of tester 100. The system 200 includes a central processing unit 202 in communication with left and right coprocessors 204 and 206. The system 200 also includes a plurality of sensors, generally designated as sensors 208. The rotary switches 106 and 108 in concert with the toggle switch 110 allow the user to select one of the sensors 208 at a time for measurement. The L/R toggle switch 110 allows the user to select the sensors on the left side of the aircraft or select the sensors on the right side of the aircraft.

Figure 5:
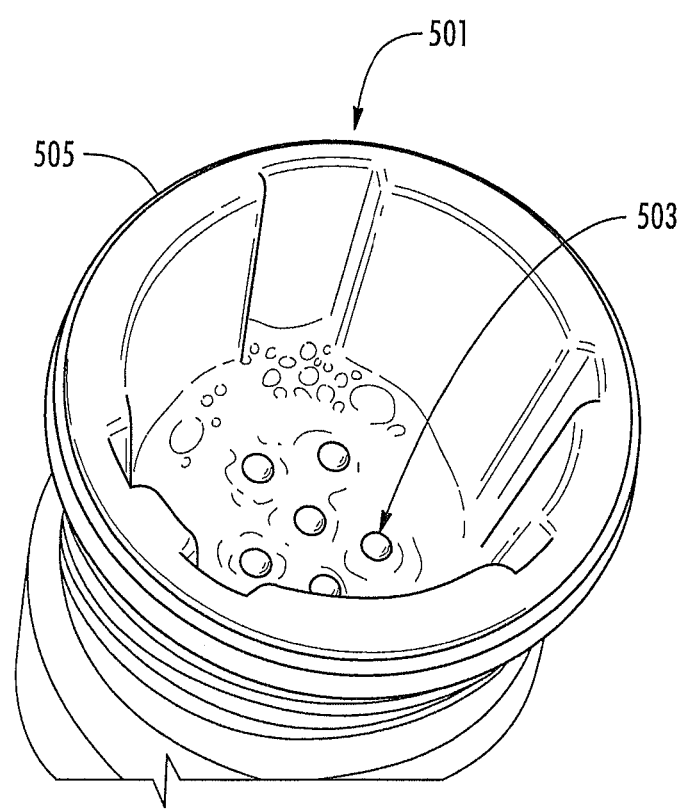
FIG. 5 shows a sensor connector that can be tested using the tester shown in FIGS. 1A-3.

Referring now also to FIG. 5, which shows an exemplary sensor connector 501. Sensor connector 501 has a plurality of sensor pins 503 and a connector shell 505. During testing, tester 100 ties together all the sensor pins 503 associated with a given sensor. Tester 100 uses connector shell 505 as a signal ground line.

It will be appreciated that embodiments of the tester 100 can be made completely portable, inexpensive, and battery operated. However, alternative embodiments can include further complexity. For example, alternative embodiments can include a built-in functionality such as a built-in voltmeter and a processor for determining whether the sensor passes or fails based on the measured voltage across resistor 118. Such alternative embodiments can include a display, such as a pass/fail indicator, for displaying the test results.

It will also be appreciated that alternative values can be measured other than the voltage across resistor 118 for determining a pass/fail condition. For example, the amount of electrical current passing through resistor 118 can instead be measured, and the pass/fail condition can be determined based on the amount of electrical current, or based on a calculated voltage, where the voltage is calculated using the known resistance of resistor 118 and the measured current according to Ohm's Law (V=IR).

The tester 100 can test for electrical current leakage from a signal line to shield or other ground in a convenient effective way without risking damage to the sensors. Testing all of a plurality of an aircraft's (or other vehicle's) sensors' wiring can be achieved in only a few minutes using the rotary switches 106 and 108 instead of hours or days compared to conventional ohmmeter or hi-pot testers. The tester 100 provides enough voltage to sense the leakage current without risk of damage to the sensors or the sensor wiring. Damage to sensors is not possible because all of the sensor wires are electrically connected to the same potential.

Thus, disclosed herein is a test system for testing a sensor system, where the test system comprises a test-system connector, a high-impedance resistor, a selector switch, a voltage source, and first and second test points. The test-system connector is configured for mating with a sensor-system connector. The test-system connector comprises a conductive housing, first and second conductive signal leads, and insulating material. The insulating material is disposed between the first and second signal leads, and the insulating material is also disposed between the housing and each of the first and second signal leads. The high-impedance resistor is connected between the housing and the signal leads. The selector switch includes first and second selector-switch positions, where the high-impedance resistor is electrically connected to the first conductive signal lead when the selector switch is in the first selector-switch position, and where the high-impedance resistor is electrically connected to the second conductive signal lead when the selector switch is in the second selector-switch position. The voltage source is configured for applying a voltage between the high-impedance resistor and the conductive housing of the test-system connector. The first and second test points allow for measuring the voltage across the high-impedance resistor while the voltage is being applied. The measured voltage across the high-impedance resistor can then be used to determine whether there is any leakage current in the sensor system.

Figure 6:
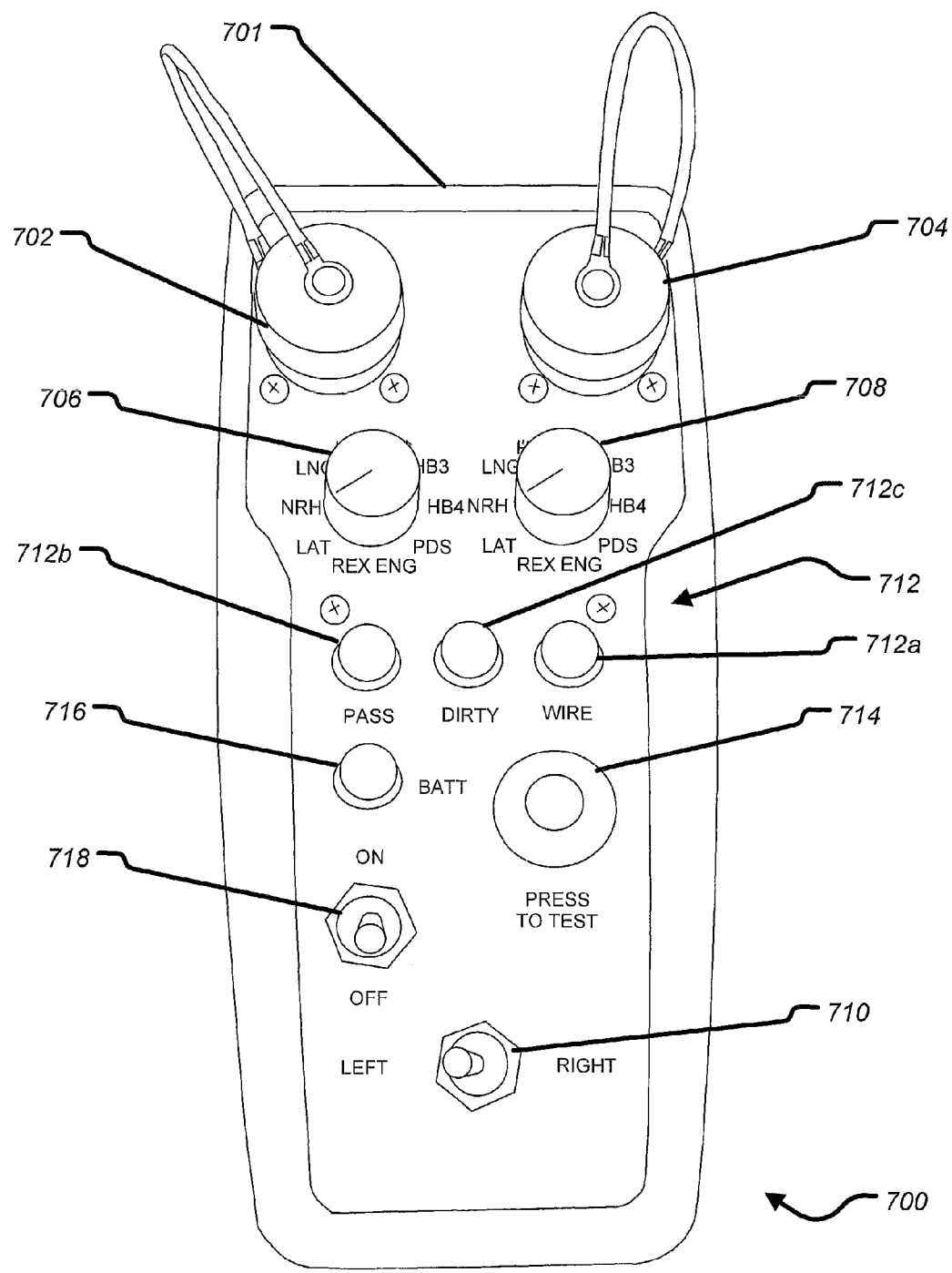
FIG. 6 shows a plan view of an improved tester according to the present application.

Referring now also to FIG. 6, a plan view of an improved leakage detector is illustrated. Tester 700 includes connectors 702 and 704 that are configured to connect to the aircraft wiring at the vibration computer disconnect. Connectors 702 and 704 are covered with tethered removable caps to prevent debris from becoming lodged inside the connectors while disconnected from the aircraft. Connectors 702 and 704 include filtered pin configured to prevent high frequency noise and electro-magnetic interference into the detector. Tester 700 is a hand-held tester that measures electrical leakage from sensor pins to the connector shell and cable shield. In the preferred embodiment, tester 700 does not require an external power source because it is internally battery powered, which adds to the portability of tester 700. Individual sensors are selected one at a time using the tester rotary switches 706 and 708 and left-right toggle switch 710, thereby enabling a plurality of sensors be tested within only a few minutes. Indications of electrical leakage for each sensor tell the maintainer that the specific sensor should be removed and cleaned, or replaced. A metallic case 701 is configured to enclose the components of tester 700 while also providing a hand-held platform. Utilizing a voltmeter with leads to measure the output voltage can be problematic as the leads of the voltmeter can pick up interference from radio frequency sources and produce unreliable results.

Previous versions of the leakage detector required the concurrent use of voltage sensing multi-meter electrical coupled to the leakage detector. The multi-meter enabled the user to measure the voltage and correlate that to the condition of the sensor. Leakage detector 700 does not utilize a voltage sensing multi-meter to provide the user with conditional information regarding the sensors. Leakage detector 700 includes a series of comparators wired to indicator lights 712. Indicator lights 712 are illuminated by the user depressing switch 714. Depressing switch 714 applies a high voltage over a resistor and causing any contamination in the sensor to conduct by ionization. The current flow produces a voltage that is measured/compared. When the voltage is high then wire fault illuminator 712a is illuminated. When the voltage is low then passing sensor illuminator 712b is illuminated. When the voltage is between low and high then dirty sensor illuminator 712c is illuminated. Battery indicator 716 illuminates when the internal battery power source is sufficiently powered to properly detect leakage. Switch 718 allows users to turn the tester 700 off to preserve battery power.

Figure 7:
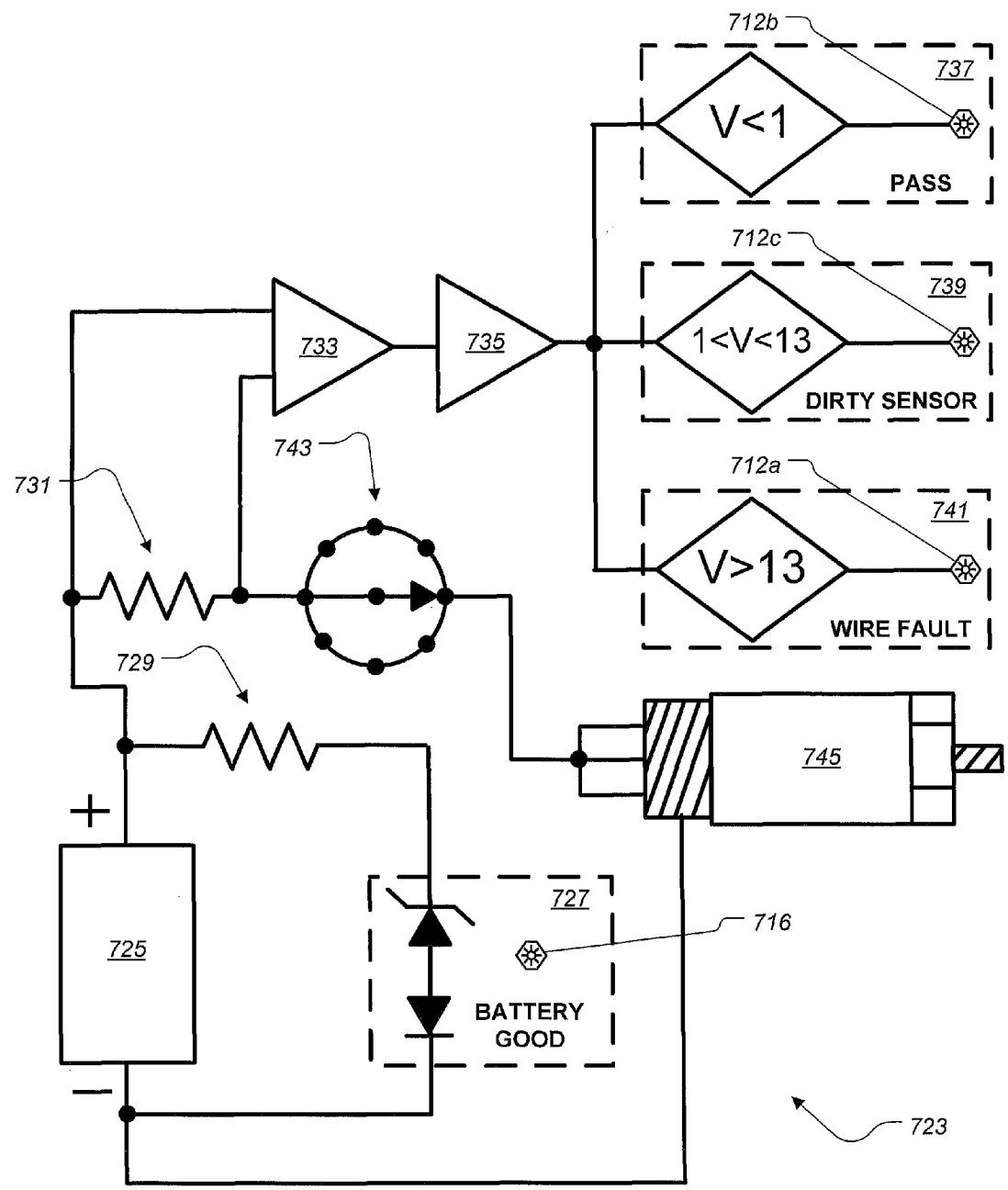
FIG. 7 shows a simplified schematic view of the tester shown in FIG. 6.

Referring now also to FIG. 7, a high level diagram of an improved system for detecting sensor leakage is illustrated. The improved system 723 includes a power supply 725, power indicator 727, a first resistor 729, a second resistor 731 which is a high-impedance resistor like resistor 118, a operational amplifier 733, a filter 735, a passing indicator 737, a dirty indicator 739, a wire fault indicator 741, a rotary switch 743, and a sensor to be tested 745. System 723 as shown does not include a left/right switch and an additional rotary switch for ease of description.

Power supply 725 is preferably a 27 volt direct current supply made up of three 9 volt batteries wired in series. Power indicator 727 is comprised of a zener diode with a light source such that while the current from the power supply 725 is high enough to overcome the zener diode the light source will illuminate. Preferably the zener diode is sized at 18 volts. First resistor 729 is preferably 30.1 k Ohm. Therefore so long as the voltage of the power supply 725 is over 20 volts the light source will be illuminated. When the voltage of the power supply 725 drops below 20 volts the intensity of the illumination from the light source will diminish alerting the user to replace the batteries before detecting sensor leakage.

A high voltage, of at least 20 volts, is applied to pins of sensor 745 through the rotary switch 743 to detect current leakage. The high voltage causes contamination in the connectors to ionize and become conductive. The conductive contamination produces a current flow or leakage current through second resistor 731. The leakage current through the second resistor 731 generates a contamination voltage to be across the input of the operational amplifier 733. The output of the operational amplifier 733 is filtered by filter 735 and then compared, by three voltage comparators, to determine the condition of the sensor 745 based on the voltage output of the filter 735. Filter 735 is preferably a low pass filter set at eight tenths of a hertz. If the filtered contamination voltage is less than a passing sensor voltage, such as a single volt, the sensor 745 is considered good and illuminates the passing indicator 737. If the filtered contamination voltage is greater than or equal than, the passing sensor voltage, such as a volt or less than or equal to or greater than a wire fault voltage, such as thirteen volts, the sensor 745 is considered dirty and illuminates the dirty indicator 739. If the filtered voltage is greater than the wire fault voltage, such as thirteen volts, there is a wiring fault and illuminates the wire fault indicator 741. A simulated connector with various simulated conditions improves the system 700. The simulated connector includes a simulated sensor that is dirty and causes the system 700 to illuminate the dirty indicator. The simulated connector includes a simulated sensor that is clean and causes the system 700 to illuminate the clean indicator. The simulated connector includes a simulated sensor that is shorted to ground and causes the system 700 to illuminate the wire fault indicator. The user rotates through the rotary switch as they test several simulated sensors one at a time. The simulated connector is coupled to the system through connector 702.

Leakage detector 700 is an improvement over previous devices at least because of the following reasons: the user doesn't have to decide whether a sensor has passed or failed as the system makes the determination; the system is hardened against EMI; and because the system is sealed and therefore more rugged against moisture, sand, and dust.

It is apparent that a system and method with significant advantages has been described and illustrated. The particular embodiments disclosed above are illustrative only, as the embodiments may be modified and practiced in different but equivalent manners apparent to those skilled in the art having the benefit of the teachings herein. It is therefore evident that the particular embodiments disclosed above may be altered or modified, and all such variations are considered within the scope and spirit of the application. Accordingly, the protection sought herein is as set forth in the description. Although the present embodiments are shown above, they are not limited to just these embodiments, but are amenable to various changes and modifications without departing from the spirit thereof.

What is claimed is:

1. A sensor test system, comprising:
   a case configured to house a circuit;
   a power source for producing a voltage;
   a cable electrically connecting a first sensor to the circuit;
   the first sensor comprising multiple connector pins and a grounded connector shell;
   wherein the circuit comprises:
     a high-impedance resistor connected between the power source and the multiple connector pins;
     a return line from the grounded connector shell to the power source, such that the voltage produced from the power source renders a contaminant conductive, in that the contaminant provides conductive path between the multiple connector pins and the grounded connector shell and produces a contamination voltage across the high-impedance resistor, while the contaminant also provides a contaminant resistance;
     a first comparator comparing the contamination voltage to a wire fault voltage;
     a second comparator comparing the contamination voltage to a passing sensor voltage; and
     a third comparator comparing the contamination voltage to a dirty sensor voltage;
   wherein the dirty sensor voltage is greater than the passing sensor voltage and less than a wire fault voltage.

2. The sensor test system of claim 1, wherein the voltage is approximately 28 volts.

3. The sensor test system of claim 1, further comprising:
   a power source tester;
   wherein the power source tester signals when the voltage produced by the power source is less than 20 volts.

4. The sensor test system of claim 1, further comprising:
   a wire fault indicator;
   wherein the wire fault indicator illuminates when the contamination voltage is greater than 13 volts.

5. The sensor test system of claim 1, further comprising:
   a passing sensor indicator;
   wherein the passing sensor indicator illuminates when the contamination voltage is less than 1 volt.

6. The sensor test system of claim 1, further comprising:
   a dirty sensor indicator;
   wherein the dirty sensor indicator illuminates when the contamination voltage is greater than 1 volt and less than 13 volts.

7. The sensor test system of claim 1, further comprising:
   a second sensor connected to the circuit with the cable;
   a switch for selectively changing electrical connectivity of the circuit between the first sensor and the second sensor.

8. The sensor test system of claim 1, wherein the high-impedance resistor is between 100 k Ohms and 1 M Ohms.

9. The sensor test system of claim 1, wherein the case is metallic.

10. The sensor test system of claim 1, wherein the case is sealed against dust and moisture.

11. The sensor test system of claim 1, further comprising: filtered pins between the circuit and the first sensor.

12. The sensor test system of claim 1, further comprising: a self test connector.

* * * * *